United States Patent [19]

Parikh et al.

[11] Patent Number: 5,181,231
[45] Date of Patent: Jan. 19, 1993

[54] NON-VOLATILE COUNTING METHOD AND APPARATUS

[75] Inventors: Harsh B. Parikh, Houston; Robert M. Crosby, Missouri City, both of Tex.

[73] Assignee: Texas Instruments, Incorporated, Dallas, Tex.

[21] Appl. No.: 620,499

[22] Filed: Nov. 30, 1990

[51] Int. Cl.$^5$ .............................................. H03K 21/40
[52] U.S. Cl. ..................................... 377/26; 377/24.1
[58] Field of Search ................................. 377/24.1, 26

[56] References Cited

U.S. PATENT DOCUMENTS

| | | | |
|---|---|---|---|
| 4,663,770 | 5/1987 | Murray et al. | 377/24.1 |
| 4,757,522 | 7/1988 | Kieselstein | 377/24.1 |
| 4,803,707 | 2/1989 | Cordan, Jr. | 377/24.1 |
| 4,839,909 | 6/1989 | Warner | 377/24.1 |
| 4,860,228 | 8/1989 | Carroll | 377/24.1 |
| 4,947,410 | 7/1990 | Lippmann et al. | 377/24.1 |

Primary Examiner—John S. Heyman
Assistant Examiner—Scott A. Ouellette
Attorney, Agent, or Firm—Rose K. Castro; Robby T. Holland; Richard Donaldson

[57] ABSTRACT

A non-volatile counter memory is provided by using a gray code scale to store counter values in a plurality of counter memories (34) comprising a counter memory group (38). Each counter memory comprises a plurality of units which store a gray coded value. The weighting of the units is changed after a predetermined number of write operations such that the number of bit transitions is spread out among the units.

27 Claims, 4 Drawing Sheets

NON-VOLATILE COUNTING METHOD AND APPARATUS

NOTICE: (C) Copyright, Texas Instruments Incorporated 1990. A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyrights whatsoever.

TECHNICAL FIELD OF THE INVENTION

This invention relates in general to electronic circuits, and more particularly to a non-volatile counting method and apparatus.

BACKGROUND OF THE INVENTION

In many applications, it is desirable to store the output of a counter in a non-volatile memory, such that if power is lost, the last count will be retained. For example, in an automobile odometer, the accrued mileage must be retained even during loss of power in order to reliably reflect the mileage of the automobile. Hence, in order to implement a digital electronic odometer, some type of non-volatile memory backup is necessary. Similarly, an electronic power meter would need some non-volatile memory backup, since loss of usage data would mean a loss in revenue.

EEPROMs are often used for non-volatile storage of data, because they may be electronically erased. In a counting application, however, it is desirable to store each incremented counter value in order to prevent the loss of any data. As a result, the least significant bits of an EEPROM memory undergo many more bit transitions than do the most significant bits. The least significant bit changes from a "one" to a "zero" or from a "zero" to a "one" on each count. The most significant bit will undergo a transition from a zero to a one only once during the entire range of values output by the counter.

Each transition between logic states creates stress on the associated bit. EEPROM memory cells are typically rated to withstand over 10,000 bit transitions. After 10,000 transitions, an EEPROM memory cell is considered unreliable. Consequently, if a counter sequences through 10,000 binary outputs, the least significant bit of a EEPROM memory storing each output will become unreliable for data storage. Therefore, if an application requires a sequence of numbers greater than 10,000, the EEPROM will cease to be a reliable storage medium. Furthermore, in practice, a cell may fail before the rated number of transitions; consequently, if an application, such as an odometer, requires a reliable storage mechanisms, the EEPROM rating cannot be relied upon.

One solution to the aforementioned problem is to shift to a new group of memory locations after a predetermined number of writes. For example, for a 24-bit counter, three memory locations would be needed. If locations 100$h$ to 102$h$ ("h" denotes a hexadecimal number representation) were used to store the output of the 24-bit counter, after 10,000 transitions, locations 103$h$ to 105$h$ would be used to store the output. This solution, however, wastes memory since memory location 101$h$ has had only moderate use and memory location 102$h$ has had no use.

Therefore, a need has arisen in the industry to provide a method and apparatus for reliably storing the output of a counter in a non-volatile memory and for detecting and correcting errors.

SUMMARY OF THE INVENTION

In accordance with the present invention, a method and apparatus for storing the output of a counter is provided which substantially eliminates the disadvantages with prior methods and apparatus.

In the present invention, a sequence of numbers is stored in a non-volatile memory comprising a plurality of predefined units each operable to store a portion of a number. The order in which the portions of the number are stored in the memory units is varied, such that the bit transitions are spread out over a plurality of the units.

The present invention provides several technical advantages over the prior art. Because of the order in which the portions of the number are stored in the memory units are varied, the number of bit transitions may be averaged over a plurality of units. Consequently, the EEPROM memory is efficiently used to maximize the number of counts which may be reliably stored.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE INVENTION

The preferred embodiment of the present invention and its advantages are best understood by referring to FIGS. 1-6 of the drawings, like numerals being used for like and corresponding parts of the various drawings.

Figure 1:
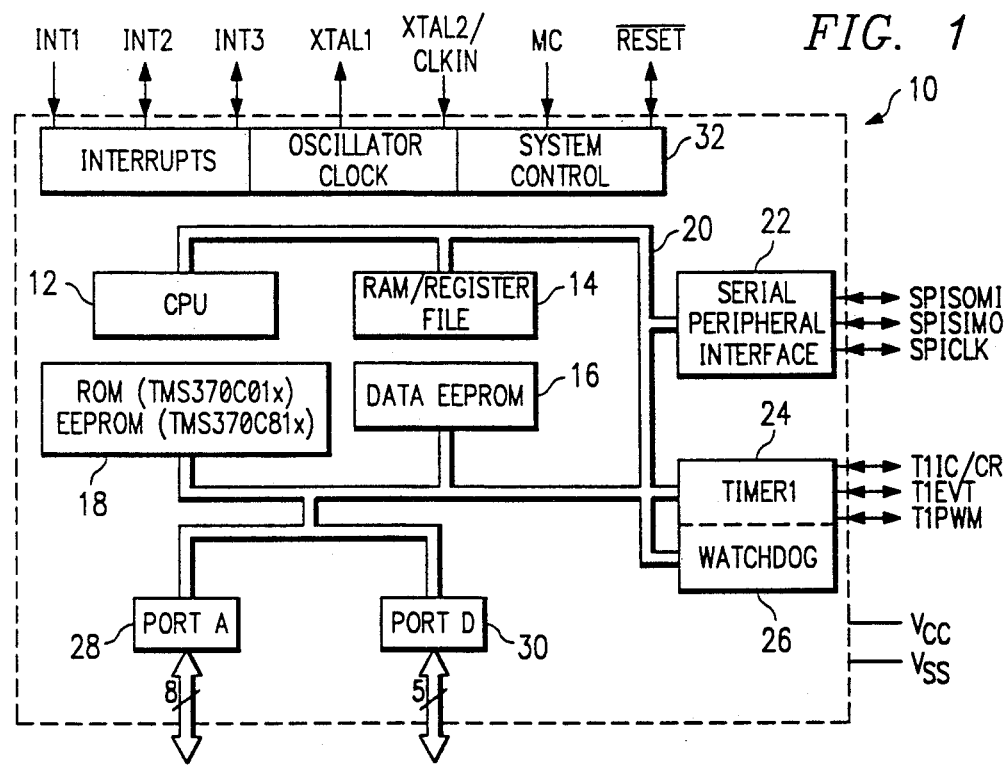
FIG. 1 illustrates a block diagram of a counting circuit.

FIG. 1 illustrates a preferred embodiment of a microcontroller which may be used to implement the present invention. The microcontroller 10 includes a CPU 12, a RAM/Register file 14, a data EEPROM 16 and a program memory 18, which may be a ROM or EEPROM. A bus 20 couples the CPU 12, RAM/Register file 14, data EEPROM 16 and program memory 18. A serial peripheral interface 22 couples the bus 20 with external signals, shown as SPISOMI (Slave Out, Master In), SPISIMO (Slave In, Master Out) and SPICLK (Clock). A timer circuit 24 is coupled to the bus 20 and to external signal T1C1/CR (Counter Reset), TIEVT (External Event Input) and TIPWM (Pulse Width Modulation output). A watchdog timer circuit 26 is also coupled to the bus 20. Port A 28 and Port D 30 provide an 8-bit and 5-bit port to the bus 20 which may be programmed as either a digital input or a digital output. Control circuitry 32 handles interrupts (INT1, INT2 and INT3), external clocks signals (XTAL1 and XTAL2/CLKIN) and control signals MC (Mode Control) and RESET.

The microcontroller illustrated in FIG. 1 is based on the TMS370 family sold by Texas Instruments Incorporated of Dallas, Tex. Various members of the TMS370 family have different or additional features and capacities. The CPU is a 8-bit processor with status register, program counter, and stack pointer internal to the CPU module. The CPU 12 uses the RAM/Register file 14 as working registers, accessed on the bus 20. The bus 20 also allows access to the memories 16 and 18 and the peripheral interfaces 22. The register file portion of the RAM/Register file 14 provides 256 registers to the CPU 12. The other RAM modules are mapped after the register file. The data EEPROM 16 contains 256 bytes of electrically erasable programmable read-only memory. The EEPROM can be programmed and erased under program control. The program memory 18 contains four kilobytes of memory, and may be a ROM or an EEPROM. The timer circuit 24 may be programmed to count events, compare the counter contents to a preset value, or time-out after a preset interval. The results of these operations can generate an interrupt to the CPU 12, set flag bits, reset the timer-counter, toggle an I/O line, or generate pulse-width-modulated (PWM) outputs. The watchdog timer circuit 26 can be programmed to generate a hardware reset upon time-out. If not needed as a watchdog, this timer can be used as a general purpose timer. The serial peripheral interface facilitates communication between the CPU and external peripheral devices.

For purposes of illustration, it will be assumed that the microcontroller 10 is coupled to an external sensor via INT1. The sensor generates an interrupt to the CPU 12 on a predetermined interval. For example, in an odometer application, the sensor may generate an interrupt every tenth of a mile. Alternatively, in a power meter application, the sensor may generate an interrupt for every tenth of a kilowatt hour. Upon receiving the interrupt, the microcontroller reads a count value from the data EEPROM 16 and increments the count, as discussed in greater detail hereinbelow. Other methods for providing the count could also be used, for example, receiving the count from an external counter.

Figure 2:
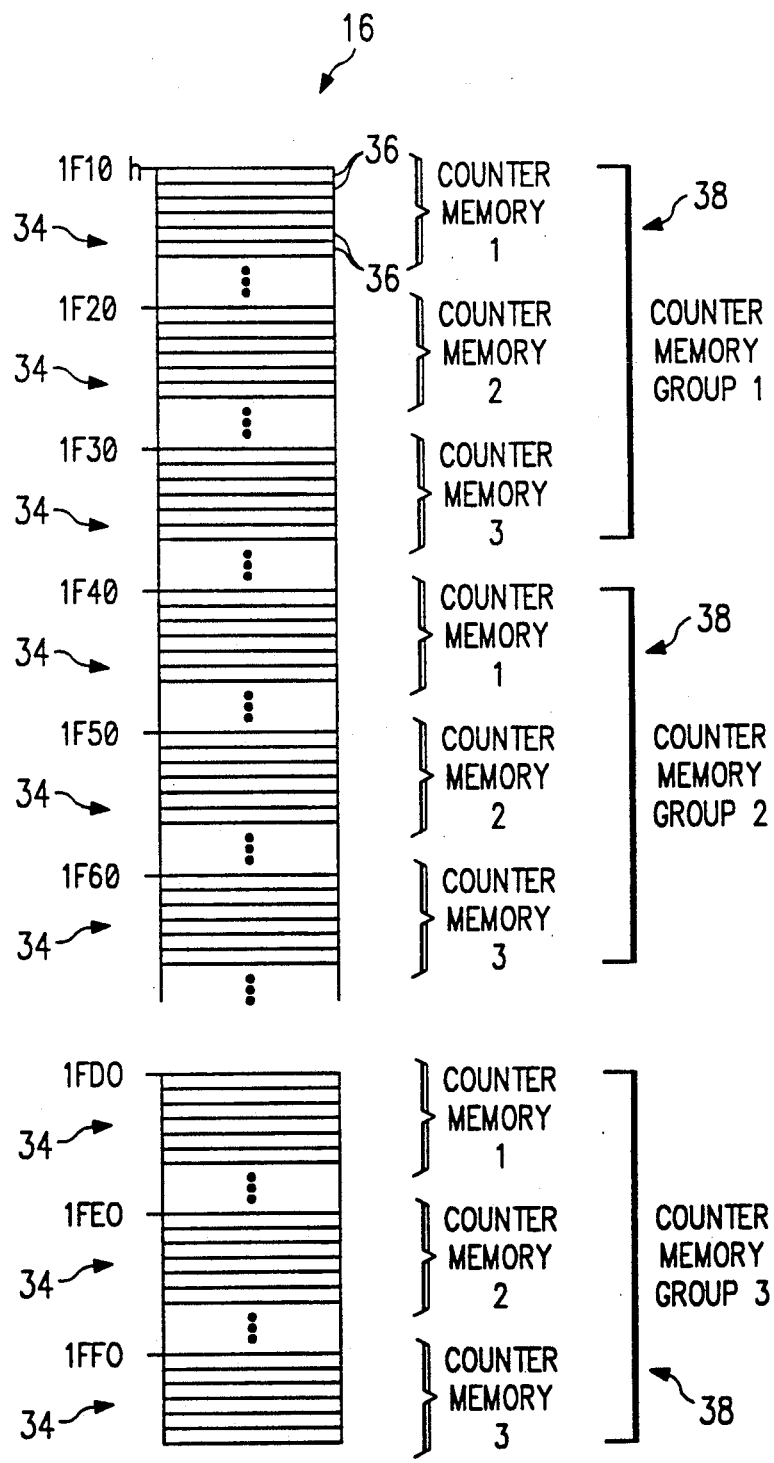
FIG. 2 illustrates a block diagram of the counting groups used in a preferred embodiment of the present invention for a 24-bit counter.

FIG. 2 illustrates the organization of the EEPROM memory 16 into counter memories and counter memory groups. For purposes of illustration, FIG. 2 assumes that the portion of the EEPROM memory 16 used for the counter memories starts at address, 1F10h (all addresses being described in hexadecimal notation). Each counter memory 34 comprises six bytes 36. Hence, counter memory1 comprises the bytes at the locations 1F10-1F15. For programming ease, the boundary for each counter memory begins on a hexadecimal boundary. Therefore, counter memory2 begins at address 1F20, counter memory3 begins at address 1F30 and so on.

Each counter group 38 comprises three counter memories. Hence, counter group1 comprises the counter memories starting at locations 1F10, 1F20 and 1F30, counter memory group2 comprises the counter memories beginning at 1F40, 1F50 and 1F60, and so on. Within each counter memory 34, each byte stores the value of a single hexadecimal digit. Thus, the six bytes store six hexadecimal digits, which corresponds to a 24-bit counter.

Figure 3:
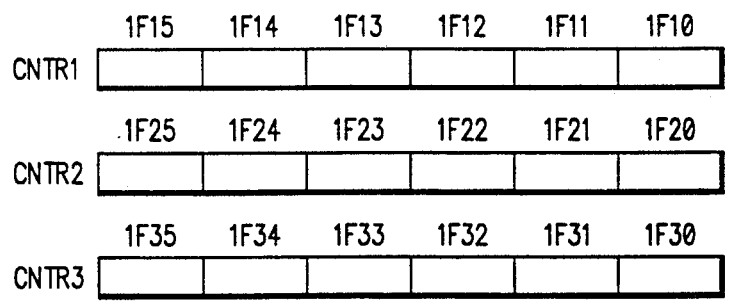
FIG. 3 illustrates a block diagram of a single memory group.
Figure 4:
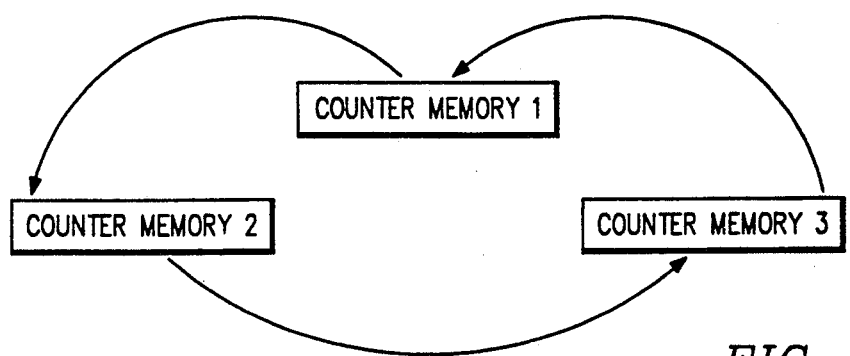
FIG. 4 illustrates a block diagram of the sequence of storage within a single counting group.

FIG. 3 illustrates the bytes comprising a counter memory group 38, using counter memory group1 of FIG. 2 as an example. FIG. 4 illustrates the order of writing into the counter memories 34 of a counter memory group 38. Referring to FIGS. 1, 2, 3 and 4, the output of the sensor is successively stored in the three counter memories 34 of a counter memory group 38. Thus, for the sequence of numbers from "1" to "6", "1" would be stored in counter memory1, "2" would be stored in counter memory2, "3" would be stored in counter memory3, "4" would be stored in counter memory1, "5" would be stored in counter memory2 and "6" would be stored in counter memory3. Consequently, from the viewpoint of a single counter memory, the value stored therein increments by three on each write cycle to that memory. For example, counter memory 1 would store values one, four, seven, and so on, incrementing by three on each cycle through the three counter memories 34.

TABLE 1

| Gray Code Scale for Increment by 3 | |
|---|---|
| Hexadecimal Value | Binary Representation |
| 0 | 0 0 0 0 0 0 0 0 |
| 1 | 1 1 1 1 1 0 0 0 |
| 2 | 0 0 1 1 1 1 1 1 |
| 3 | 0 0 0 0 0 0 0 1 |
| 4 | 1 1 1 1 0 0 0 0 |
| 5 | 0 1 1 1 1 1 1 1 |
| 6 | 0 0 0 0 0 0 1 1 |
| 7 | 1 1 1 0 0 0 0 0 |
| 8 | 1 1 1 1 1 1 1 1 |
| 9 | 0 0 0 0 0 1 1 1 |
| A | 1 1 0 0 0 0 0 0 |
| B | 1 1 1 1 1 1 1 0 |
| C | 0 0 0 0 1 1 1 1 |
| D | 1 0 0 0 0 0 0 0 |
| E | 1 1 1 1 1 1 0 0 |
| F | 0 0 0 1 1 1 1 1 |

TABLE 1 illustrates a gray code scale for an increment by three to denote each hexadecimal value stored in the bytes 36. As can be seen from TABLE 1, each increment by three results in a transition of only 1-bit. In the TMS370, for example, a single bit of the EEPROM memory 16 can be addressed for programming or erasing. In writing gray coded counter values to the EEPROM memory 16, a transition of the stored contents of a byte from "1" to "4" changes the bit data from "11111000" to "11110000". Hence, the fourth bit changes from one to zero, and all other bits remain the same. Consequently, for each count only one bit need be changed in one byte of the counter memory to account for the transition. If the transition of the counter value results in a transition of the next highest hexadecimal digit (for example, from "00000D" to "000010"), then at most, two bits will change, each in a separate byte. The gray codes can be stored in the memory as a look-up table.

If gray coding were used as the sole means to reduce the bit stress of the EEPROM memory cells, the bytes storing the least significant hexadecimal digits would wear out significantly before the bytes storing the most significant hexadecimal digits. For example, after storing a sequence of 10,000 numbers, counter memory1 would undergo 3,334 transitions (since it stores one out of every three numbers) spread out over eight bits of each of three bytes. Thus, each bit of the least significant byte would have been stressed 416 times. The bits of the adjacent byte would be stressed only twenty-six times. The next byte would have bits which were stressed at most two times. Consequently, the byte holding the least significant digit would wear out far before the more significant digits.

In the preferred embodiment, five of the six bytes defining the count are swapped after a predetermined number of write cycles. For example, the bytes may be swapped after every 10000h counts. By using 10000h as the swapping criteria, the swapping can occur every time the fifth most significant digit changes.

TABLE 2

| Fixed Byte Content | Digit Swapping Table Weight of Each Location Within a Counter Memory | | | | | |
|---|---|---|---|---|---|---|
| 1F×4h | 1F×5h | 1F×4h | 1F×3h | 1F×2h | 1F×1h | 1F×0h |
| 0 | 6 | 5 | 4 | 3 | 2 | 1 |
| 1 | 4 | 5 | 3 | 2 | 1 | 6 |
| 2 | 3 | 5 | 2 | 1 | 6 | 4 |
| 3 | 2 | 5 | 1 | 6 | 4 | 3 |
| 4 | 1 | 5 | 6 | 4 | 3 | 2 |
| 5 | 6 | 5 | 4 | 3 | 2 | 1 |
| 6 | 4 | 5 | 3 | 2 | 1 | 6 |
| 7 | 3 | 5 | 2 | 1 | 6 | 4 |
| 8 | 2 | 5 | 1 | 6 | 4 | 3 |
| 9 | 1 | 5 | 6 | 4 | 3 | 2 |
| A | 6 | 5 | 4 | 3 | 2 | 1 |
| B | 4 | 5 | 3 | 2 | 1 | 6 |
| C | 3 | 5 | 2 | 1 | 6 | 4 |
| D | 2 | 5 | 1 | 6 | 4 | 3 |
| E | 1 | 5 | 6 | 4 | 3 | 2 |
| F | 6 | 5 | 4 | 3 | 2 | 1 |

TABLE 2 illustrates a digit swapping table, where the number "1" indicates that the associated byte stores the least significant digit of the counter value and the number "6" indicates that it is the most significant digit. The fifth digit is always stored in the same memory location since it defines the weighting of the other bytes.

For example, when the contents of the byte representing the fifth digit (at address 1F24 for counter memory 2 of counter group 1) contains a zero, then the first byte (1F20) contains the first (least significant) digit, the next byte (1F21) contains the second digit, the next byte (1F22) contains the third digit, the next byte (1F23) contains the fourth digit, the next byte (1F24) contains the fifth digit, and the next byte (1F25) contains the sixth digit. After 10000h counts, the fifth digit will transition from a zero to a one. At this point, the values of the bytes will be swapped such that the first byte (1F20) stores the sixth (most significant) digit, the next byte (1F21) contains the first digit, the next byte (1F22) contains the second digit, the next byte (1F23) contains the third digit, the next byte (1F24) contains the fifth digit, and the next byte (1F25) contains the fourth digit. The fifth digit remains in the same byte, since this digit defines the weighting for all other bytes. The weighting will remain the same for another 10000h counts, at which time the weighting of the bytes will be swapped again as shown in TABLE 2.

Consequently, the gray code results in distributing bit transitions evenly over all the bits of a byte and the digit swapping distributes the bit transitions over each byte of the counter memory (although the fifth byte does not experience as many bit transitions as the other bytes).

The use of three counter memories 34 per counter memory group 38, as shown in FIG. 4, guarantees better data integrity. If the power is lost while writing a counter value, or if a bit failure occurs in one of the counter memories 34, one byte in the set of three counter memories may have been corrupted. An error detection routine notes an incongruence in the count sequence and makes a correction by determining the proper number based on the contents of the other two sets in the group. If a byte is corrupted during normal operation of the counter (i.e., without a power failure), the program moves to the next counter memory group. If, on the other hand, corrupted data is found after a system reset, the EEPROM location might still be useful and the correction value is restored into the corrupted byte, based on the values in the other two counter memories of the group.

Figure 5:
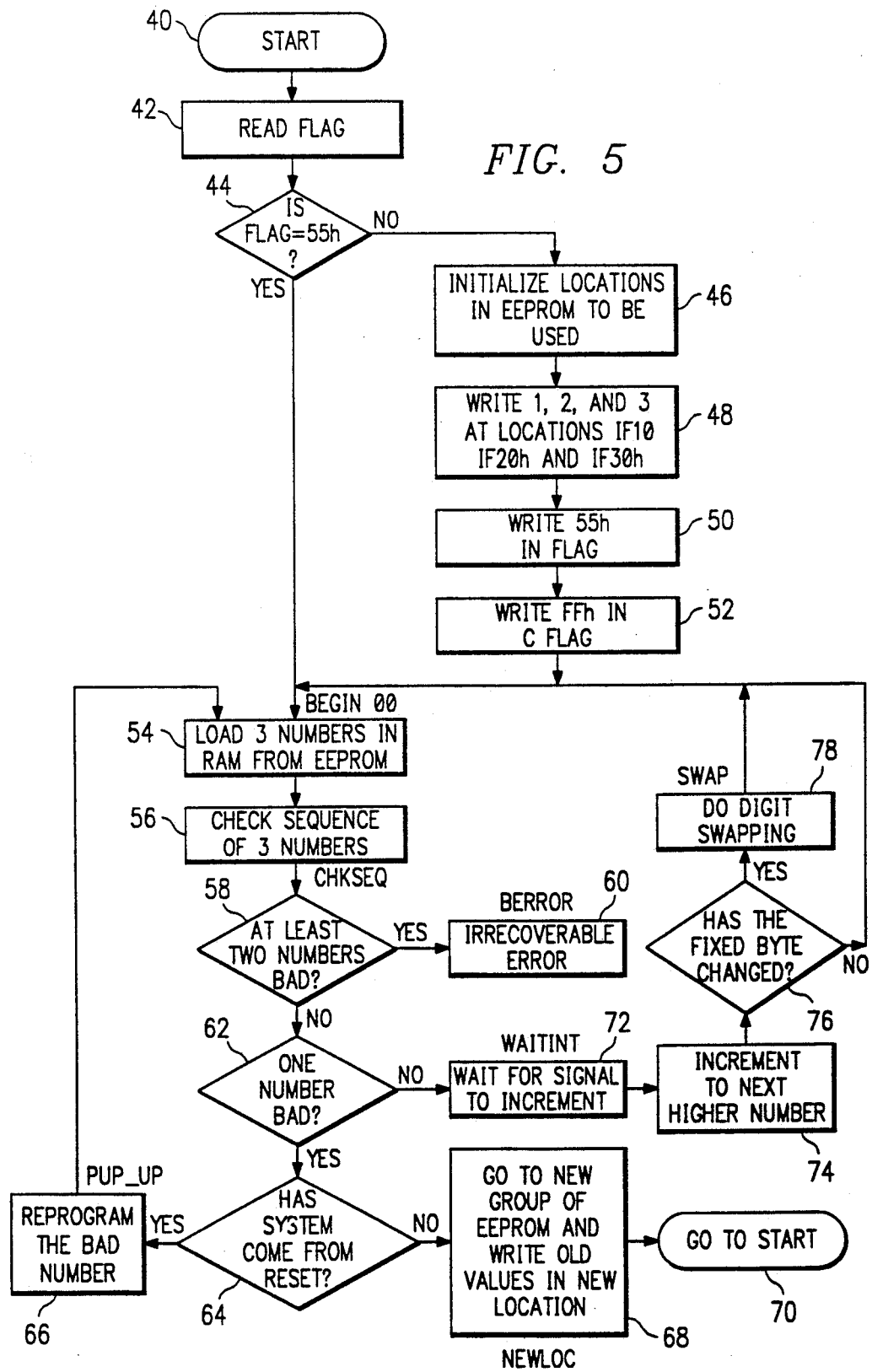
FIG. 5 illustrates a flow chart describing a sequence of operations to be used in the present invention.

FIG. 5 illustrates a flow chart depicting overall operation of the 24-bit counter. The counter operations can be controlled by the CPU 12 in conjunction with the program memory 18.

Start block 40 denotes the beginning of the counter operation. In block 42, a memory location denoted as "FLAG" is read. For example, FLAG could have an address of 1F1F of the EEPROM memory 16. FLAG is set to a predetermined value, such as 55h after the EEPROM locations used for the counter have been initialized. In decision block 44, it is determined whether or not the FLAG equals the predetermined number. If not, the EEPROM locations are initialized in block 46 by setting all the bytes in each counter memory to "zero". In block 48, initial counter values of one, two and three are written at locations 1F10, 1F20 and 1F30, the first bytes of the three counter memories of counter memory group 1. In block 50, the value 55h is written into FLAG to denote that the initialization subprogram has been performed. In block 52, the value FF is written in a second FLAG location (for example, EEPROM location 1F17), denoted as the CFLAG. The CFLAG is used to determine which counter memory group is active.

After initialization blocks 46-52 or if FLAG is set to 55h in block 44, operation continues at block 54. In block 54, three numbers are loaded from the three counter memories of the active counter memory group. In block 56, it is determined whether or not the three numbers comprise a valid sequence. In decision block 58, if it is determined that at least two numbers are bad, operation switches to an error routine in block 60 for an irrecoverable error. In this instance, it cannot be determined which, if any, of the counter memories contains the correct counter value.

If less than two numbers are bad in decision block 58, operation continues to decision block 62 where it is determined whether or not one of the three counter memories contains an incorrect value. If so, operation continues to decision block 64 where it is determined whether or not the system has come from reset. If so, the bad number is reprogrammed in block 66 and operation loops back to block 54. If there is one number bad in decision block 62 and the system has not come from reset in block 64, then the counter memory group is chosen (since it appears that one of the EEPROM memories in the active counter memory group has failed) and the old values are written into the new locations of the new counter memory group (block 68). In block 70, operation is transferred to start block 40.

If, in decision block 62, the sequence of three values is correct, operation continues to block 72 where the CPU waits for the counter signal to increment. Once the counter increments (block 74), the new counter value is stored into the appropriate counter memory after translation into the gray code. In decision block 76, it is determine whether the fixed byte (fifth byte) has changed; if so, digit swapping is performed in block 78 as discussed in connection with TABLE 2. Thereafter, operation continues from program block 54.

Figure 6:
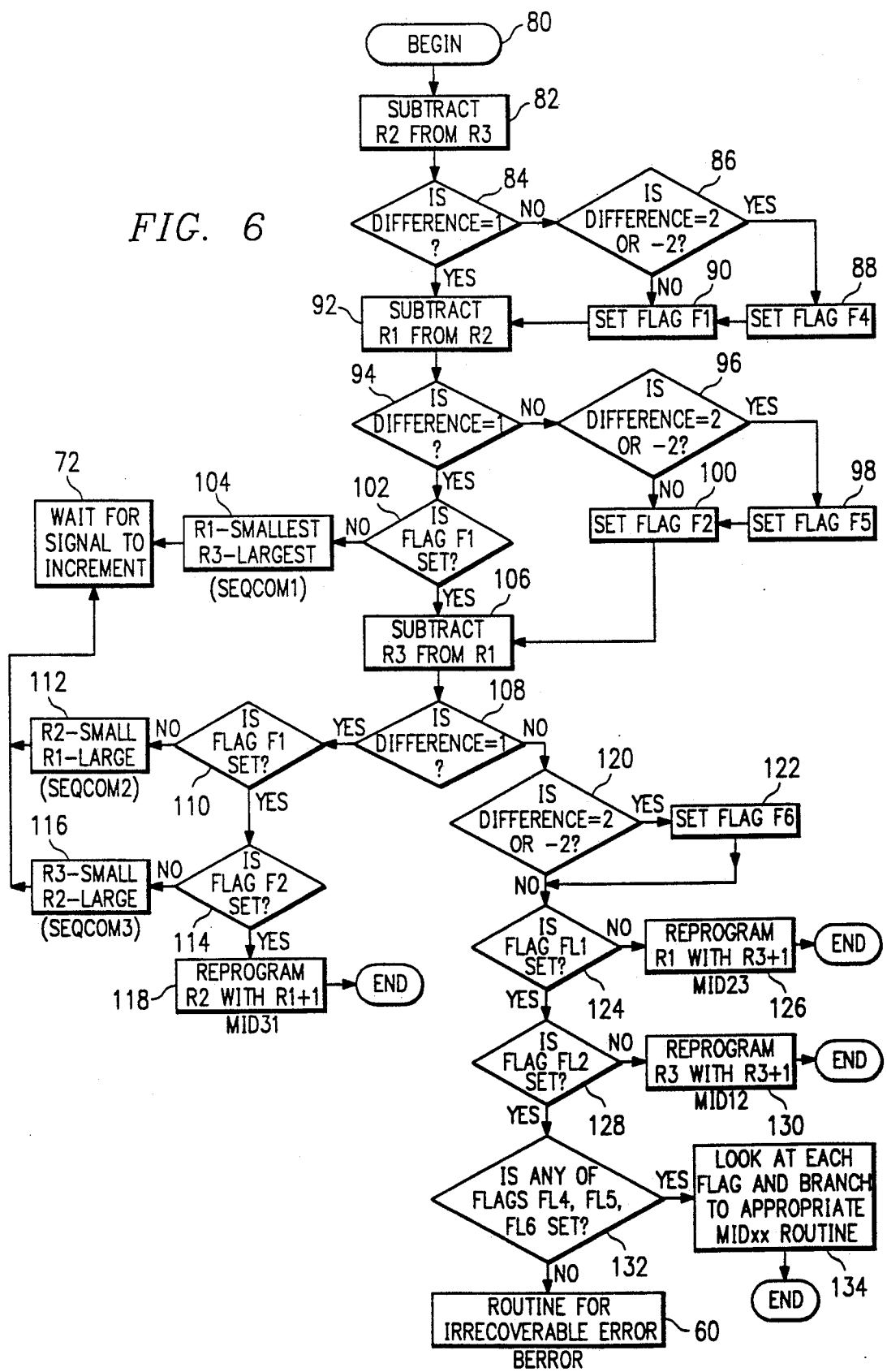
FIG. 6 illustrates a flow chart detailing the flow of operations for checking the sequence of numbers stored by a counting group.

FIG. 6 illustrates a flow chart of the operation for checking the sequence of three numbers. In this flow chart, it is assumed that the numbers retrieved from the counter memories are stored in registers R1, R2 and R3, respectively. Operation begins at block 80. In block 82, R2 is subtracted from R3. In decision block 84, it is determined whether R3 is greater than R2 by one. If not, in decision block 86, it is determined whether the difference is equal to two or minus two. If so, flags F4 and F1 are set in blocks 88 and 90. If not, flag F1 is set in block 90. After setting the appropriate flags, or if the difference is one in decision block 84, then operation continues at block 92 which subtracts R1 from R2. Decision block 94 determines whether R2 is greater than R1 by a difference of one. If not, decision block 96 determines whether the difference is two or minus two. If so, flags F5 and F2 are set in blocks 98 and 100. If not, flag F2 is set in block 100. If the R2−R1=1 in decision block 94, then in decision block 102, it is determined whether F1 is set. If F1 is not set, then it may be determined that R1 contains the smallest number and R3 contains the largest number and the numbers are in sequence (block 104). Operation then continues to block 72 of FIG. 5. If, on the other hand, flag F1 is not set in decision block 102, or if program operation is flowing from block 100, then R1 is subtracted from R3 in block 106. In decision block 108, it is determined whether R3−R1=1. If so, in decision block 110, it is determined whether flag F1 is set. If not, it may be determined that R2 contains the smallest value, R1 contains the largest value, and the count is in sequence (block 112). Operation again shifts to block 72 to wait for the signal to increment. If in decision block 110, flag F1 is set, then it is determined whether flag F2 is set in decision block 114. If flag F2 is not set, it may be determined that R2 contains the largest value and R3 contains the smallest value in block 116 and operation shifts to block 72 to wait for the signal to increment. If flag F2 is set, then there is one bad number, which is reprogrammed in block 118. If in decision block 108, R3−R1<>1, then it is determined whether the difference is two or minus two in decision block 120. If so, flag F6 is set in block 122. Operation continues to decision block 124 where it is determined whether or not flag F1 is set. If not, R1 is reprogrammed with the value equal to R3+1 (block 126). If flag F1 is set in block 124, then it is determined whether flag F2 is set in decision block 128. If not, R3 is reprogrammed with the value equal to R3+1 in block 130. If flag F2 is set in block 128, it is determined whether any of the flags F4, F5 or F6 are set in decision block 132. If not, operation is transferred to block 60 of FIG. 5 where the routine for an irrecoverable error is executed. If one of the flags is set, it can be determined that two of the numbers are in sequence and an appropriate routine is executed to reprogram the third number (block 134).

From the foregoing, it can be seen that the preferred embodiment provides several technical advantages over the prior art. Counter values are stored in the non-volatile counter memories using a scheme which minimizes the bit transitions for each write operation to the counter memories and by spreading the increments over a plurality of units comprising the counter memory, such that no one unit receives the bulk of the bit transitions.

The present invention could be implemented using more or less counter memories per counter memory group. For example, a single counter memory could be used, but this implementation would sacrifice the security of the two out of three voting scheme. If a single counter memory is used, the gray code scale shown in TABLE 3 would be used.

TABLE 3

| HEXADECIMAL VALUE | BINARY REPRESENTATION |
| --- | --- |
| 0 | 0 0 0 0 0 0 0 0 |
| 1 | 0 0 0 0 0 0 0 1 |
| 2 | 0 0 0 0 0 0 1 1 |
| 3 | 0 0 0 0 0 1 1 1 |
| 4 | 0 0 0 0 1 1 1 1 |
| 5 | 0 0 0 1 1 1 1 1 |
| 6 | 0 0 1 1 1 1 1 1 |
| 7 | 0 1 1 1 1 1 1 1 |
| 8 | 1 1 1 1 1 1 1 1 |
| 9 | 1 1 1 1 1 1 1 0 |
| A | 1 1 1 1 1 1 0 0 |
| B | 1 1 1 1 1 0 0 0 |
| C | 1 1 1 1 0 0 0 0 |
| D | 1 1 1 0 0 0 0 0 |
| E | 1 1 0 0 0 0 0 0 |
| F | 1 0 0 0 0 0 0 0 |

While the present invention has been described in connection with a counter which stores a sequence of numbers which increment by one on each interrupt, it should be noted that the counter could also effectively store any sequence, either incrementing or decrementing, regardless of the incremental value. For example, a count which decrements by 4 on each count could be easily implemented.

The counter described herein could be used in a variety of applications, such as an odometer, utility meter, printer, or any other application where a reliable non-volatile counter is required.

Although the present invention and its advantages have been described in detail, it should be understood that various changes, substitutions and alterations can be made herein without departing from the spirit and scope of the invention as defined by the appended claims.

What is claimed is:

1. A method of storing a count in a non-volatile memory comprising the steps of:
   storing a number in a non-volatile memory section comprising a plurality of predefined memory units each operable to store a portion of said number; and
   varying the order in which said portions are stored in said memory units; and
   translating each of said portions prior to said storing step such that the number of bits stressed by each storing step is minimized.

2. The method of claim 1 wherein said translating step comprises accessing a translated value from a lookup table.

3. The method of claim 1 wherein each of said units comprises eight bits operable to store a translated hexadecimal digit.

4. The method of claim 1 and further comprising the step of reading said memory section to detect possible storage errors.

5. The method of claim 4 and further comprising the step of storing subsequent numbers to another memory section after detecting a storage error.

6. The method of claim 1 wherein said step of varying the order comprises the steps of:
   storing a predetermined portion in a predetermined one of said units; and
   storing other of said portions in other of said units in a predetermined order corresponding to the value stored in said predetermined unit.

7. The method of claim 1 wherein said translating step involves changing only one bit in one portion to accomplish the translation and minimize the number of bits stressed by each storing step.

8. The method of claim 1 wherein each memory unit comprises n memories, and further wherein a value stored within each n memory increments by n on a write cycle to said n memory.

9. A method of storing a count in a non-volatile memory comprising the steps of:
   receiving a sequence of numbers;
   rotatably storing each number in a group of non-volatile memory sections each comprising a plurality of predefined memory units, each memory unit operable to store a portion of said number; and
   varying the order in which said portions are stored in said memory units, such that the number of bit transitions associated with said storing step are evenly distributed over a plurality of said units.

10. The method of claim 9 and further comprising the step of translating each of said portions prior to said storing step such that the number of bits stressed by each storing step is minimized.

11. The method of claim 10 wherein said translating step comprises accessing a translated value from a look-up table.

12. The method of claim 10 wherein each of said units comprises eight bits operable to store a translated hexadecimal digit.

13. The method of claim 9 and further comprising the step of reading said memory sections to detect possible storage errors.

14. The method of claim 13 and further comprising the step of storing subsequent numbers to another group of memory sections after detecting a storage error.

15. The method of claim 9 wherein said step of varying the order comprises the steps of:
   storing a predetermined portion in a predetermined one of said units of the memory section to which the number is being stored; and
   storing other of said portions in other of said units of such memory section responsive to the value stored in said predetermined unit.

16. Non-volatile counter circuitry comprising:
   counting circuitry for generating a sequence of numbers;
   a non-volatile memory comprising a plurality of memory sections comprised of a plurality of predefined memory units each operable to store a portion of a generated number from said counting circuitry; and
   control circuitry operable to;
   receive said generated sequence of numbers;
   store each number in said non-volatile memory such that portions of said number are stored in associated memory units;
   vary the order in which said portions are stored in said memory units; and
   translate each of said portions prior to said storing step such that the number of bits stressed by each storing step is minimized.

17. The circuitry of claim 16 wherein said non-volatile memory comprises an EEPROM memory.

18. The circuitry of claim 16 wherein each of said memory units comprises n memories, each n memory comprising a byte containing multiple bits, and further wherein the valve stored within each said memory increments by n on each write cycle to said memory.

19. The circuitry of claim 16 wherein said control circuitry is further operable to read said non-volatile memory to detect possible storage errors.

20. The circuitry of claim 19 wherein said control circuitry is further operable to store subsequent numbers to another memory after detecting a storage error.

21. The circuitry of claim 16 wherein said translating step involves changing only one bit in one portion to accomplish the translation and minimize the number of bits stressed by each storing step.

22. Circuitry for providing non-volatile storage of a count, comprising:
   counting circuitry for generating a sequence of numbers;
   a group of non-volatile memories each comprising a plurality of predefined memory units each operable to store a portion of a generated number; and
   control circuitry operable to:
   receive said generated sequence of numbers;
   rotatably store each number in said non-volatile memories;
   vary the order in which portions of each number are stored in said memory units of said non-volatile memories; and
   translate each of said portions prior to said storing step such that the number of bits stressed by each storing step is minimized.

23. The circuitry of claim 22 wherein said non-volatile memories comprise portions of an EEPROM memory.

24. The circuitry of claim 22 wherein each of said memory units comprised n memories, each n memory comprising a byte containing multiple bits, and further wherein the value stored within each said memory increments by n on each write cycle to said memory.

25. The circuitry of claim 22 wherein said control circuitry is further operable to read said memory to detect possible storage errors.

26. The circuitry of claim 25 wherein said control circuitry is further operable to store subsequent numbers to another memory after detecting a storage error.

27. The circuitry of claim 22 wherein said translating step involves changing only one bit in one portion to accomplish the translation and minimize the number of bits stressed by each storing step.

* * * * *